United States Patent
Chennimalai Sankaran et al.

(10) Patent No.: US 11,605,429 B2
(45) Date of Patent: Mar. 14, 2023

(54) METHOD OF SEARCHING THROUGH TERNARY CONTENT ADDRESSABLE MEMORY (TCAM) AND SYSTEM THEREOF

(71) Applicant: Indian Institute of Technology Madras (IIT Madras), Chennai (IN)

(72) Inventors: Ganesh Chennimalai Sankaran, Chennai (IN); Krishnamoorthy Sivalingam, Chennai (IN); Balaji Srinivasan, Chennai (IN)

(73) Assignee: INDIAN INSTITUTE OF TECHNOLOGY MADRAS (IIT MADRAS), Chennai (IN)

( * ) Notice: Subject to any disclaimer, the term of this patent is extended or adjusted under 35 U.S.C. 154(b) by 0 days.

(21) Appl. No.: 17/269,880

(22) PCT Filed: Jul. 1, 2019

(86) PCT No.: PCT/IN2019/050490
§ 371 (c)(1),
(2) Date: Feb. 19, 2021

(87) PCT Pub. No.: WO2020/039451
PCT Pub. Date: Feb. 27, 2020

(65) Prior Publication Data
US 2021/0327507 A1    Oct. 21, 2021

(30) Foreign Application Priority Data
Aug. 20, 2018 (IN) .............................. 201841031032

(51) Int. Cl.
*G11C 13/04* (2006.01)
*G11C 15/04* (2006.01)
*G06F 16/903* (2019.01)

(52) U.S. Cl.
CPC ........ *G11C 15/04* (2013.01); *G06F 16/90335* (2019.01)

(58) Field of Classification Search
CPC ..................................................... G11C 15/04
See application file for complete search history.

(56) References Cited

U.S. PATENT DOCUMENTS

| | | | |
|---|---|---|---|
| 7,254,748 B1 * | 8/2007 | Wright ................ | G06F 11/1064 711/108 |
| 2002/0101769 A1 * | 8/2002 | Garverick ............ | G02B 6/357 365/200 |
| 2009/0290128 A1 * | 11/2009 | George .................... | G02B 5/22 353/31 |
| 2017/0180687 A1 * | 6/2017 | Wang ................. | G02B 26/0833 |

* cited by examiner

*Primary Examiner* — Min Huang

(57) ABSTRACT

Present disclosure relates to a method and a system for searching through a Ternary Content Addressable Memory (TCAM). The system comprises a Digital Light Processing System (DLP) receiving an input query. The DLP comprises a 2-Dimensional array of digital micro mirrors configured for reflecting light from one or more input sources in the TCAM to a predefined position. The system further comprises a detection screen having a detection area. The detection area is configured for generating an image of a resultant pixel according to the reflection of the light, wherein the resultant pixel corresponds to a search result for an input query.

8 Claims, 3 Drawing Sheets

METHOD OF SEARCHING THROUGH TERNARY CONTENT ADDRESSABLE MEMORY (TCAM) AND SYSTEM THEREOF

The embodiments herein generally relate to Ternary Content Addressable Memory (TCAM), and more particularly to the Ternary Content Addressable Memory (TCAM) in a network router. The present application is based on, and claims priority from International application number PCT/IN2019/050490 filed on 1 Jul. 2019 and an Indian Application Number 201841031032 filed on 20 Aug. 2018, the disclosure of which is hereby incorporated by reference herein.

FIELD OF INVENTION

Background of Invention

In a field of network routing, a problem of finding a next hop for every packet processed by the network router is known as a route lookup function. The route lookup function generally involves performing a longest prefix match on an ordered set of route entries, carefully configured on a hardware component called Ternary Content Addressable Memory (TCAM).

The TCAM is specially designed for parallel search for locating a matching entry across entire TCAM in a single cycle. TCAM is a de-facto hardware used for route lookup on high-end network routers. TCAM consumes a lot of power and many proposals attempt to address the power consumption issue from different perspectives. Recent solutions provide use of magnetism, memristors and optical Random-Access Memory (RAM) for addressing power consumption issue of the TCAM.

SUMMARY

Accordingly, the disclosure provides a method of searching through a Ternary Content Addressable Memory (TCAM). The method comprises receiving an input query to be matched with a TCAM content of input bits, arranging, in a Digital Light Processing System (DLP), plurality of mirrors for directing the light from one or more input sources, over a detection screen and receiving, over a detection area in the detection screen, a superimposed light forming a resultant pixel based on the directing. The method further comprises considering the resultant pixel as a search result corresponding to the input query.

Accordingly, the disclosure also provides a system for searching through a Ternary Content Addressable Memory (TCAM). The system comprises a Digital Light Processing System (DLP) receiving an input query. The DLP comprises a 2-Dimensional array of digital micro mirrors configured for reflecting light from one or more input sources in the TCAM to a predefined position. The system further comprises a detection screen having a detection area. The detection area is configured for generating an image of a resultant pixel according to the reflection of the light, wherein the resultant pixel corresponds to a search result for an input query.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This invention is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
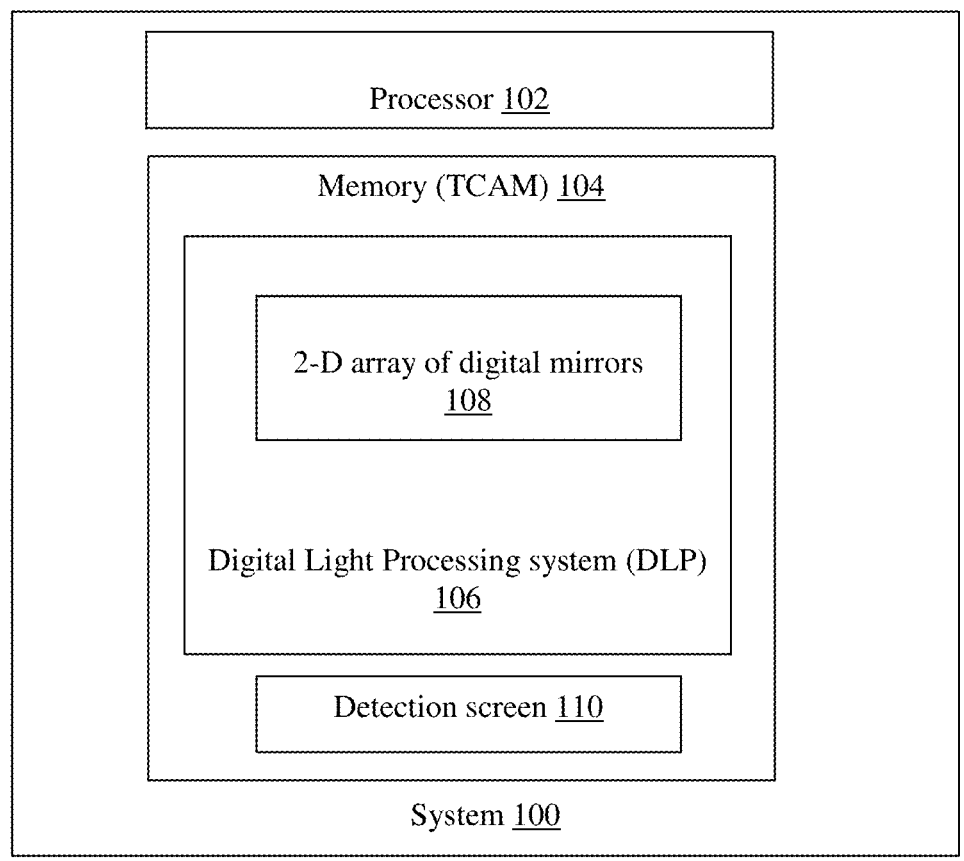
FIG. 1 illustrates a system for searching through a Ternary Content Addressable Memory (TCAM), according to an embodiment as disclosed herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

In accordance with an embodiment, present disclosure relates to a system and a method for searching through a Ternary Content Addressable Memory (TCAM). The proposed system and method may be used for searching in at least one of a network router, a web search, a processor L1 cache.

The proposed system and method takes a radically different approach of realizing the TCAM by using micro-mirrors. The micro-mirrors may be found in digital light processing (DLP) systems that are widely used in projectors. An input query is searched by using the DLP systems.

In accordance with an embodiment, referring to FIG. 1 a block diagram of a system 100 for searching through a Ternary Content Addressable Memory (TCAM) in a network router is shown. The system 100 comprises a processor 102 and a memory 104 coupled to the processor. The memory 104 comprise the TCAM 104 and stores a plurality of modules to be executed by the processor 102 for searching through the TCAM 104. The TCAM 104 in the system 100 further comprises a Digital Light Processing System (DLP) 106 receiving an input query and a detection screen 110. The input query is then processed by the processor 102 for further searching through the TCAM 104.

The DLP 106 comprises a 2-Dimensional array (2-D array) of digital micro mirrors 108 configured for reflecting light from one or more input sources in the TCAM 104 to a predefined position. In an example, at least two mirrors in the 2-D array of the digital micro mirrors 108 is arranged according to one or more entries in the TCAM 104. the one or more input sources comprises multi-colored light sources for searching on the 2-Dimensional array of digital micro mirrors for multiple input queries.

The predefined position comprises one of a reflection of the light towards the detection screen 110 (referred to as first position, reflecting the light towards an image), or reflection of light away from the detection screen 110 (referred to as a second position, reflecting light away from the image).

In another embodiment, the predefined position comprises one of a deflection of light towards a detection screen, or deflection of light away from the deflection screen.

The detection screen 110 having a detection area. The detection area is configured for generating an image of a resultant pixel according to the reflection of the light. The resultant pixel corresponds to a search result for the input query. The resultant pixel comprises one of a dark pixel or an illuminated pixel.

Figure 2:
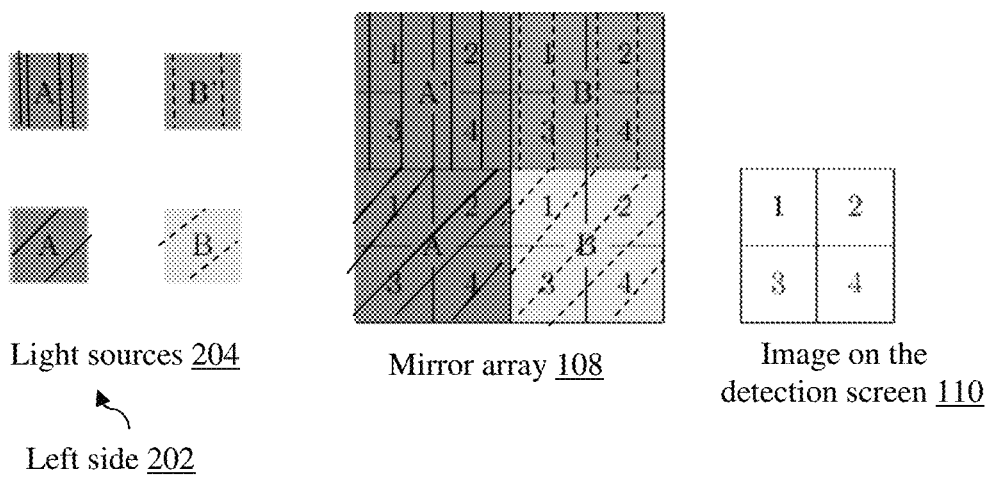
FIG. 2 illustrates an arrangement of 2-D micro mirrors in a Digital Light Processing System (DLP) of the TCAM, according to an embodiment as disclosed herein.

Referring to FIG. 2 an arrangement of the 2-D array of digital micro mirrors 108 in the TCAM 104 is shown. The arrangement is shown from an input-output perspective.

On a left side 202 of FIG. 2, at least four light sources 204 are arranged. The at least four light sources 204 may be named as A (first light source), A' (second light source), B (third light source) and B' (fourth light source). The at least four light sources 204 correspond to input bits <A, B> and a complement of the at least to input bits <A', B'> respectively.

The at least four light sources 204 illuminate respective colored zones (not shown in drawings) shown in a middle (zone of A' is shown as horizontal lines, zone of A is shown as diagonal lines, zone of B is shown as dashed horizontal lines and zone of B' is shown as dashed diagonal lines). The zone areas correspond to micro-mirror arrays 108. The micro-mirrors 108 are arranged according to the one or more TCAM entries (or entries in the TCAM 104).

The light from the micro-mirrors 108 are reflected on to the detection area in the detection screen 110 or away from the detection area in the detection screen 110. At the detection area, light from each of the A, A', B, and B' are superimposed. The detection area comprises pixels comprising one or more logical operations for the superimposition in electronic domain. In an example, the one or more logical operations comprises an OR logical operation for the superimposition. In optical domain, pixel output for the superimposition may be provided through an optical combiner.

The superimposition of zones of each of the A, A', B, and B', results in an image (also referred as a resultant image of at least four pixels. The at least four pixels 204 indicate one of a match of the input query with a corresponding entry in the TCAM 104 or a mismatch of the input query with a corresponding entry in the TCAM 104. Below is explained an exemplary embodiment explaining the functionality of the system 100:

When the one or more queries are to be matched by a TCAM entry 1 in TCAM content is <*,*>, the system 100 matches any combination of input bits. Each of the at least four mirrors corresponding to the TCAM entry 1 i.e. (A,1), (B,1), (A',1) and (B',1) are set to reflect the light away from the image. In this case, light from all the at least four sources 204 (A, A', B and B') are reflected away from the image irrespective of the input. When light from the mirrors 108 are superimposed at the detection area, the pixel corresponding to the TCAM entry always results in a dark pixel. The dark pixel is considered as a match.

Similarly, when the TCAM content at TCAM entry 2 to be matched is <0,0>, the mirrors 108 corresponding to (A',2) and (B',2) are set to reflect the light away from the image whereas mirrors 108 corresponding to (A,2) and (B,2) are set to reflect light on to the image. The reflection corresponding to (A',2) and (B',2) and the reflection corresponding to (A,2) and (B,2) results in a dark pixel only when each of the light source A and the light source B do not launch any light whereas, A' (complementary to A) and B' (complementary to B) launches light. Such case corresponds to A=B=0 scenario, thereby achieving the match for the input query.

Similarly, by configuring one or more different arrangements of the at least four mirrors 108, an arbitrary match condition may be achieved through one of a Content Addressable Memory (CAM) or the TCAM.

The at least four mirrors 108 may be arranged based on predefined patterns for computing the match towards the input query. In an example, if pattern P1=0x0x (x stands for wild card) and pattern P2=10xx are two patterns to be matched then the at least four mirrors are arranged according to the patterns P1 and P2. Let input query received is 1010 then at least eight light sources emit light based on the input query and according to the arrangement of the mirrors. The match for the input query to be detected on the detection screen depends on:

(a) whether a corresponding light source 204 of the at least eight light sources 204 is on, and (b) whether the mirror 108 reflects light towards the detection screen 110.

In the case as considered here, there are 8 light sources, first four light sources 204 of the 8 light sources corresponds to an actual input I=1010 and second four light sources corresponds to a complement of I referred as I'=0101.

Left most bit corresponding to 0 alone is considered here now. The first mirror 108 of the 8 mirrors is arranged to reflect light on to the detection screen (left most bit of P1=0x0x) and light is in on state (left most bit of I=1010). So, there is light on the detection screen 110. In this case, the predefined pattern considered here may not match.

For the second pattern (P2=10xx) considered here, the first mirror 108 is arranged to deflect light away from the detection screen 110. So, when first light source is on (I=1010), there is no light (detected as a half match). Now the mirror corresponding to complementary input (or I') is arranged to deflect light on the detection screen 110. Left most bit of I' is 0 so, the corresponding light source does not emit light. Therefore, there is no light on the detection screen 110. So, this predefined pattern matches here.

Similarly, for every bit of the input query, at least two light sources 204 and at least two pre-arranged mirrors 108 determine the directing of the light in one of a direction on the detection screen 110 (no match condition) or away from the detection screen 110 no light (match condition). In a similar way, a comparison may be performed for all input bits in the input query against pre-arranged mirrors and the result corresponding to a pattern is super-imposed. First dark area (or imply the dark area) corresponds to the first matching pattern thereby giving the search result corresponding to the input query.

Figure 3:
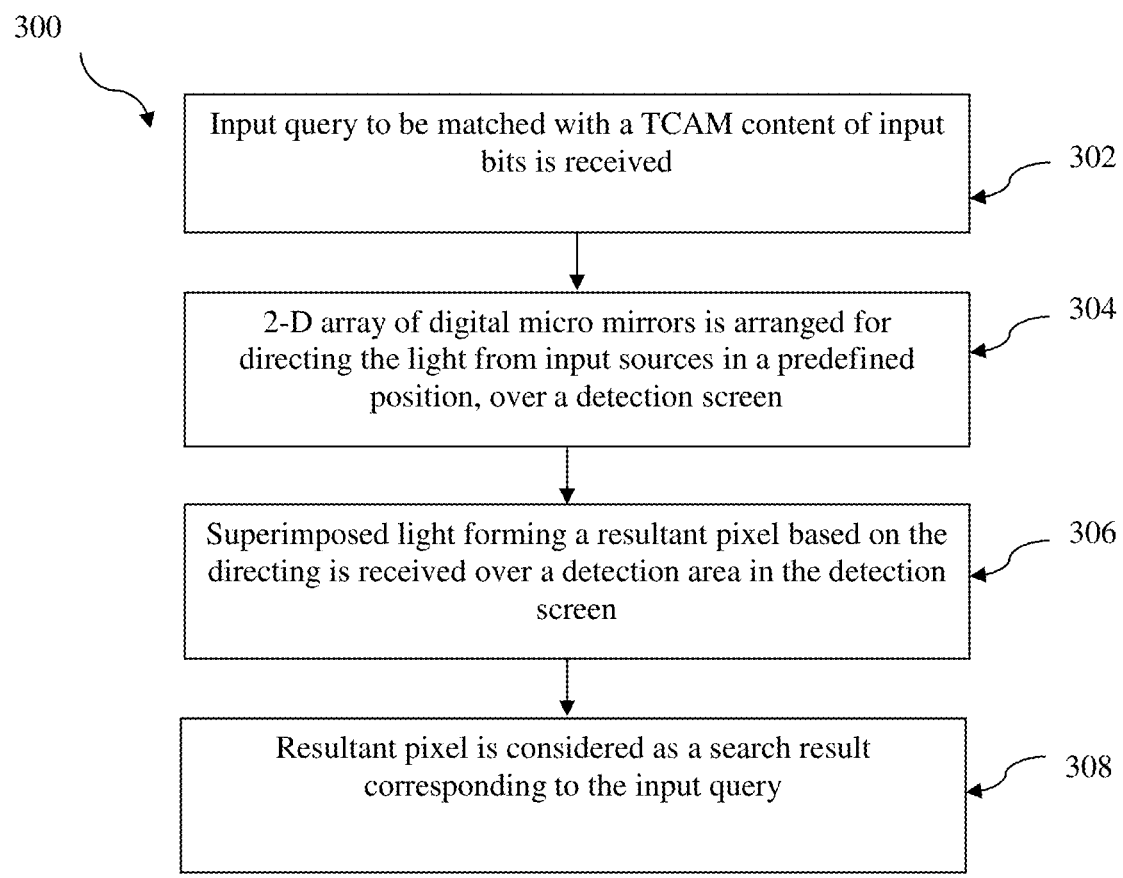
FIG. 3 illustrates a method for searching through a Ternary Content Addressable Memory (TCAM), according to an embodiment as disclosed herein.

In accordance with an alternate embodiment, referring to FIG. 3, a method 300 for searching through a Ternary Content Addressable Memory (TCAM) in a network router is shown. The method 300 may be executed by the system 100 as discussed above and the TCAM may be considered as the TCAM 104.

At step 302, an input query to be matched with a TCAM content of input bits in received.

At step 304, plurality of mirrors is arranged in a Digital Light Processing System (DLP). The DLP is similar to the DLP 106 as discussed above. The plurality of mirrors directs light from one or more input sources to a detection screen. The plurality of mirrors is similar to the 2-D array of micro mirrors 108 and the detection screen is similar to the detection screen 110 as discussed above.

At step 306, a superimposed light forming a resultant pixel based on the directing is received over a detection area in the detection screen 110.

At step 308, the resultant pixel is considered as a search result corresponding to the input query.

By using the disclosed system 100 and the method 300, the number of searches may be increased by using multiple colors on the same TCAM. The disclosed system 100 and the method may support 100 billion or more searches per second.

In the disclosed system 100 and method 200 as discussed above, a complementary logic circuit may also be constructed with fully illuminated pixels indicating a match. A liquid crystal display (LCD)-based system (alternate of the system 100) may also be constructed. A content addressable memory (CAM) can also be constructed by using each of the DLP and the LCD.

In the proposed system 100 and method 300, update time depends on switching speeds of mirror. The switching speed of mirrors is in a range of microseconds. Thus, to overcome a limitation due to switching speed, an active-standby configuration of the system 100 may be used. In the active-standby configuration, one of a standby or TCAM 2 is programmed with a latest set of entries and then an active-standby switch over happens. All searches are performed on the TCAM 2 while TCAM 1 is taken offline.

The embodiments disclosed herein can be implemented through at least one software program running on at least one hardware device and performing management functions to control the elements. The elements shown in FIGS. 1-3 include blocks which can be at least one of a hardware device, or a combination of hardware device and software module.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A method of searching through a Ternary Content Addressable Memory (TCAM), the method comprising:
    receiving an input query to be matched with a TCAM content of input bits;
    arranging, in a Digital Light Processing System (DLP) of the TCAM, a 2-Dimensional array of digital micro mirrors, for directing light from one or more input sources in a predefined position, over a detection screen, wherein the predefined position comprises one of a deflection of light towards the detection screen, or deflection of light away from a deflection screen;
    receiving, over a detection area in the detection screen, a superimposed light forming a resultant pixel based on the directing, wherein the resultant pixel indicates one of a match of the input query with a corresponding entry in the TCAM content of input bits; and
    considering, the resultant pixel as a search result corresponding to the input query.

2. The method as claimed in claim 1, wherein the directing the light in the predefined position comprises one of a directing a reflection of light from the 2-Dimensional array of digital micro mirrors towards an image on the detection screen, or directing the reflection of light from the 2-Dimensional array of digital micro mirrors away from the image on the detection screen.

3. The method as claimed in claim 1, wherein the resultant pixel comprises one of a dark pixel or an illuminated pixel.

4. A system for searching through a Ternary Content Addressable Memory (TCAM), the system comprising:
    a Digital Light Processing System (DLP) in the TCAM for receiving an input query, the DLP comprising:
    a 2-Dimensional array of digital micro mirrors configured for directing light from one or more input sources in the TCAM to a predefined position, wherein the predefined position comprises one of a deflection of light towards a detection screen, or deflection of light away from a deflection screen; and a detection screen having a detection area, wherein the detection area is configured for generating an image of a resultant pixel according to the directing of the light in the predefined position, wherein the resultant pixel indicates one of a match of the input query with a corresponding entry in the TCAM content of input bits, wherein the resultant pixel corresponds to a search result for the input query.

5. The system as claimed in claim 4, wherein at least two mirrors in the 2-D array of the digital micro mirrors is arranged according to each bit in one or more entries in the TCAM.

6. The system as claimed in claim 4, wherein the predefined position comprises one of a reflection of light towards a detection screen, or reflection of light away from the detection screen.

7. The system as claimed in claim 4, wherein the resultant pixel is one of a dark pixel or an illuminated pixel.

8. The system as claimed in claim 4, wherein the one or more input sources comprises multi-colored light sources for searching on the 2-Dimensional array of digital micro mirrors for multiple input queries.

\* \* \* \* \*